United States Patent
Shin et al.

(10) Patent No.: US 10,297,389 B2
(45) Date of Patent: May 21, 2019

(54) THIN-FILM CAPACITOR HAVING ASYMMETRIC SHAPED VIAS

(71) Applicant: SAMSUNG ELECTRO-MECHANICS CO., LTD., Suwon-si, Gyeonggi-do (KR)

(72) Inventors: Hyun Ho Shin, Suwon-si (KR); Seung Mo Lim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/485,472

(22) Filed: Apr. 12, 2017

(65) Prior Publication Data
US 2018/0033560 A1  Feb. 1, 2018

(30) Foreign Application Priority Data

Jul. 28, 2016 (KR) .......................... 10-2016-0096170
Sep. 1, 2016 (KR) .......................... 10-2016-0112396

(51) Int. Cl.
*H01G 4/33* (2006.01)
*H01G 4/012* (2006.01)
(Continued)

(52) U.S. Cl.
CPC .............. *H01G 4/33* (2013.01); *H01G 4/012* (2013.01); *H01G 4/1227* (2013.01);
(Continued)

(58) Field of Classification Search
CPC ................................ H01G 4/33; H01G 4/012
See application file for complete search history.

(56) References Cited

U.S. PATENT DOCUMENTS 8,008,161 B2 * 8/2011 Bachmann .......... H01L 27/0805
257/E21.004
8,498,095 B2 * 7/2013 Yano ...................... H01G 4/005
361/303

(Continued)

FOREIGN PATENT DOCUMENTS

JP     2000-514243 A     10/2000
JP     2008-251972 A     10/2008
(Continued)

OTHER PUBLICATIONS

Office Action in corresponding Korean Patent Application No. 10-2016-0112396, dated Aug. 22, 2017 (With Full English Translation).

*Primary Examiner* — David M Sinclair
(74) *Attorney, Agent, or Firm* — Morgan, Lewis & Bockius LLP

(57) ABSTRACT

A thin-film capacitor includes a body in which a plurality of dielectric layers and first and second electrode layers are alternately disposed on a substrate and first and second electrode pads disposed on external surfaces of the body, wherein a plurality of vias are disposed within the body, and the plurality of vias includes a first via electronically connects the first electrode layer and the first electrode pad and penetrates through from one surface of the body to a lowermost first electrode layer adjacent to the substrate; and a second via electronically connects the second electrode layer and the second electrode pad and penetrates through from one surface of the body to a lowermost second electrode layer adjacent to the substrate. The plurality of vias has a multi-stage shape, and a top view of each of the plurality of vias is asymmetric in shape.

12 Claims, 11 Drawing Sheets

(51) Int. Cl.
*H01G 4/30* (2006.01)
*H01G 4/12* (2006.01)
*H01G 4/232* (2006.01)
*H01L 23/48* (2006.01)
*H01L 49/02* (2006.01)
*H01G 4/008* (2006.01)
*H05K 1/16* (2006.01)

(52) U.S. Cl.
CPC ............ *H01G 4/232* (2013.01); *H01G 4/306* (2013.01); *H01L 23/481* (2013.01); *H01L 28/60* (2013.01); *H01G 4/008* (2013.01); *H05K 1/162* (2013.01)

(56) References Cited

U.S. PATENT DOCUMENTS

| | | | | |
|---|---|---|---|---|
| 9,030,800 | B2 * | 5/2015 | Namikawa | ............ H01G 4/306 361/301.4 |
| 2006/0180938 | A1 | 8/2006 | Kurihara et al. | |
| 2008/0237794 | A1 | 10/2008 | Shoji | |
| 2010/0252527 | A1 * | 10/2010 | Takeshima | ............ H01G 4/228 216/13 |
| 2011/0075317 | A1 * | 3/2011 | Oikawa | .................. H01G 4/005 361/303 |
| 2013/0043509 | A1 * | 2/2013 | Cho | .................. H01L 27/11526 257/208 |
| 2013/0258545 | A1 * | 10/2013 | Yano | ...................... H01G 4/306 361/301.4 |

FOREIGN PATENT DOCUMENTS

| | | | |
|---|---|---|---|
| JP | 2008252011 A | * | 10/2008 |
| JP | 5160052 B2 | | 3/2013 |
| JP | 2015-070058 A | | 4/2015 |
| KR | 10-2006-0091224 A | | 8/2006 |
| WO | 98/00871 A1 | | 1/1998 |

* cited by examiner

THIN-FILM CAPACITOR HAVING ASYMMETRIC SHAPED VIAS

CROSS-REFERENCE TO RELATED APPLICATION(S)

This application claims the benefit of priority to Korean Patent Application No. 10-2016-0096170 filed on Jul. 28, 2016 and No. 10-2016-0112396 filed on Sep. 1, 2016 in the Korean Intellectual Property Office, the entire disclosure of which is incorporated herein by reference.

BACKGROUND

1. Technical Field

The present disclosure relates to a thin-film capacitor.

2. Description of Related Art

Recently, portable information technology (IT) products such as smartphones, wearable devices, and the like, have been increasingly reduced in thickness. As such, necessity for thin passive elements to reduce a thickness of an overall product package is on the increase.

To this end, demand for thin-film capacitors that may have a smaller thickness than a thickness of multilayer ceramic capacitors (MLCCs) is growing.

In manufacturing capacitor products using a thin film method, a method for forming a via for connection between an external electrode and an electrode layer and connection between electrode layers is important since the via forming method and a final structure of the via affect performance of the thin-film capacitors.

In a related art thin-film capacitor manufacturing method, when a via is formed after repeatedly stacking dielectric layers and electrode layers, a single via is required for a single electrode layer, and vias corresponding to the number of electrode layers are formed.

Further, as a method for patterning in stacking electrode layers, even numbered electrode layers and odd numbered electrode layers are stacked in different forms and one sides are etched to expose only even numbered or odd numbered electrode layers to connect an electrode.

However, the aforementioned methods are relatively complicated and may incur increased manufacturing costs, and thus, an easy manufacturing technique for a compact thin-film capacitor is required.

When stacking a plurality of dielectric layers using a thin film manufacturing technique, it is very important to stably connect electrode layers disposed above and below each of the dielectric layers to enhance product reliability.

SUMMARY

An aspect of the present disclosure may provide a reliable compact thin-film capacitor with high capacitance.

According to an aspect of the present disclosure, a thin-film capacitor may include a body in which a plurality of dielectric layers and first and second electrode layers are alternately disposed on a substrate, and first and second electrode pads disposed on external surfaces of the body, wherein a plurality of vias are disposed within the body, and among the plurality of vias, a first via connects the first electrode layer and the first electrode pad and penetrates through from one surface of the body to a lowermost first electrode layer adjacent to the substrate, a second via connects the second electrode layer and the second electrode pad and penetrates through from one surface of the body to a lowermost second electrode layer adjacent to the substrate, the plurality of vias have a multi-stage shape, and a top view of each of the plurality of vias is asymmetric in shape, and the top view of each of the plurality of vias has a first axis in a direction where the plurality of vias are arranged, shorter than a second axis in a direction perpendicular to the first axis.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments will now be described in detail with reference to the accompanying drawings.

Hereinafter, a thin-film capacitor according to the present exemplary embodiment will be described.

Figure 1:
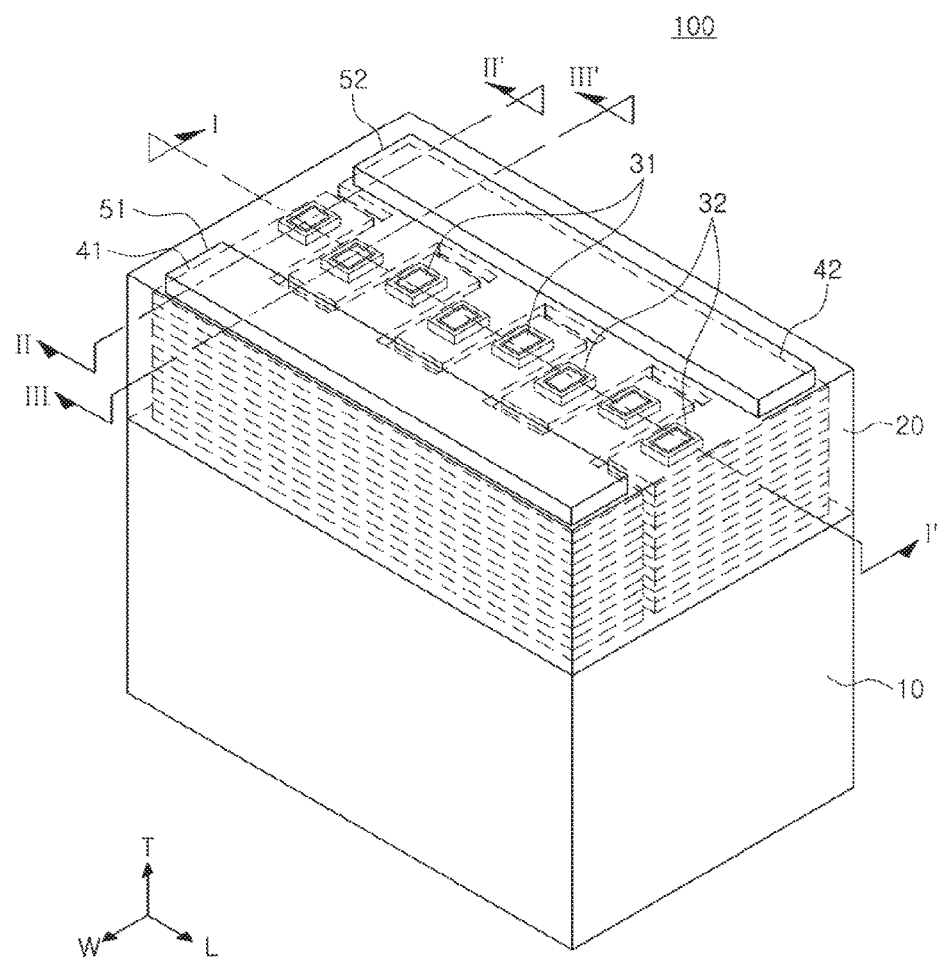
FIG. 1 is a schematic perspective view of a thin-film capacitor according to an exemplary embodiment.
Figure 2:
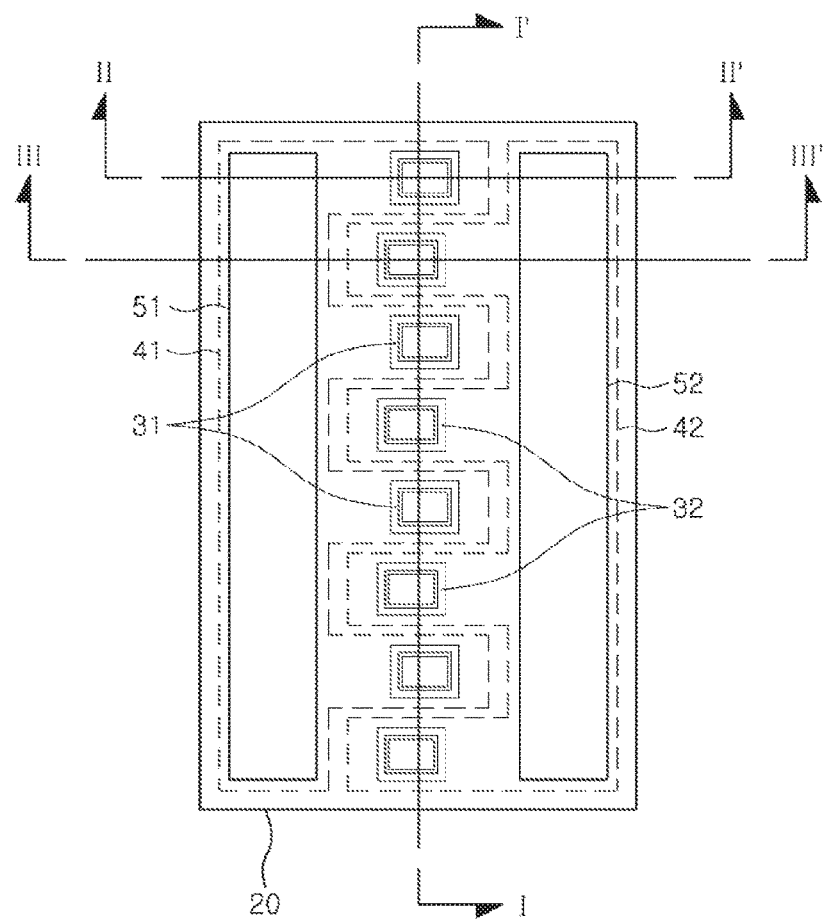
FIG. 2 is a planar view of a thin-film capacitor according to an exemplary embodiment.
Figure 3:
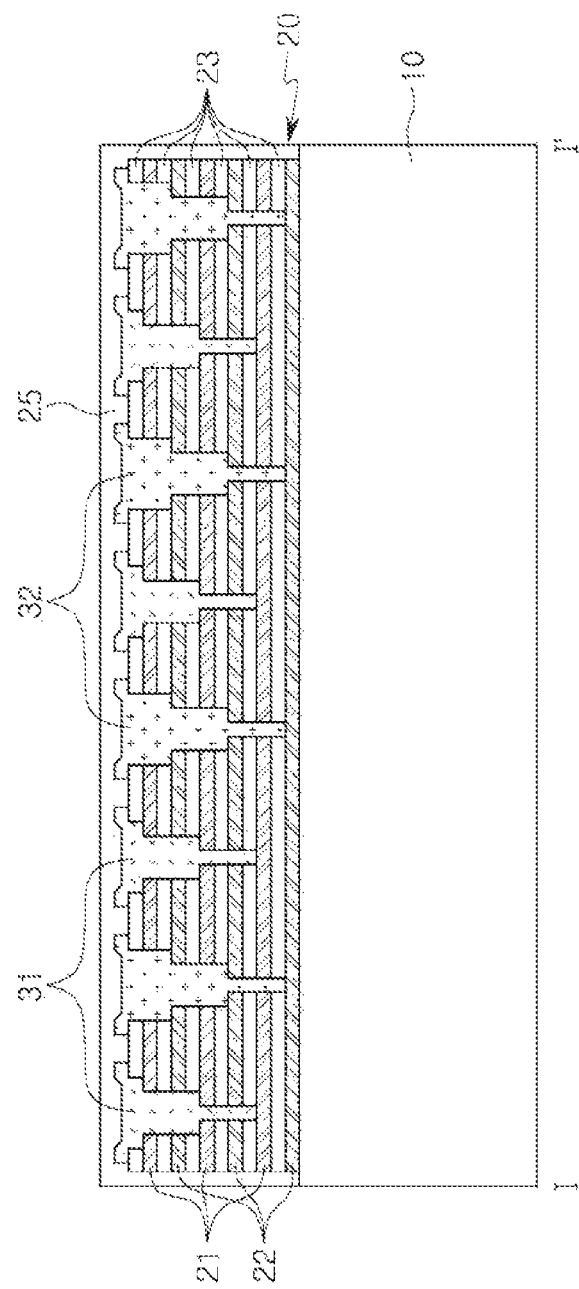
FIG. 3 is a cross-sectional view taken along line I-I' of FIG. 1.

FIG. 1 is a schematic perspective view of a thin-film capacitor according to an exemplary embodiment, and FIG. 2 is a planar view of a thin-film capacitor according to an exemplary embodiment. FIG. 3 is a cross-sectional view of a thin-film capacitor according to an exemplary embodiment, taken along line I-I' of FIG. 1.

Referring to FIGS. 1, 2 and 3, a thin-film capacitor 100 according to an exemplary embodiment includes a body 20 formed by alternately stacking first and second electrode layers 21 and 22 and a dielectric layer 23 on a substrate 10; a plurality of first vias 31 disposed in the body 20 and electrically connected to the first electrode layer 21; a plurality of second vias 32 electrically connected to the second electrode layer 22 and alternately disposed in the body 20 with the first via 31; first and second electrode pads 51 and 52 disposed outside the body 20 and arranged in positions where the first and second electrode pads 51 and 52 do not overlap with the first and second vias 31 and 32 with respect to a stacking direction; a first connection electrode 41 disposed outside the body 20 and connecting the first electrode pad 51 and the first via 31; and a second connection electrode 42 disposed outside the body 20 and connecting the second electrode pad 52 and the second via 32.

According to the exemplary embodiment, a length direction of the thin-film capacitor may be defined as an "L" axis of FIG. 1, a width direction may be defined as a "W" axis, and a thickness direction may be defined as a "T" axis of FIG. 1. The thickness direction may be used as a direction in which the dielectric layers and the electrode layers are piled up, i.e., a "stacking direction."

The body 20 is not limited to its shape but generally in a hexahedral shape. Also, the thin-film capacitor 100 may be a high-stacked thin-film capacitor with high capacitance having a size of 0.6 mm×0.3 mm, but not limited to its dimensions, and having capacitance of 1.0 μF or more.

The substrate 10 may have insulating properties in a layer (substrate) in contact with the first and second electrode layers 21 and 22, and may be formed of one selected from $Al_2O_3$, $SiO_2/Si$, MgO, $LaAlO_3$, and $SrTiO_3$, but not limited thereto. The substrate 10 preferably has sufficient flatness and surface roughness.

According to the exemplary embodiment, and a top view of each of the plurality of vias 31 and 32 is asymmetric in shape, and the top view of each of the plurality of vias 31 and 32 has a first axis in a direction where the plurality of vias 31 and 32 are arranged, shorter than a second axis in a direction perpendicular to the first axis.

In general, when a vias connecting internal electrodes of a thin-film capacitor is in a concentric circular shape with its cross-sectional in a multi-stage shape, i.e., a stepped shape, a problem can arise in that, as the stacking number of the internal electrodes increases, an outer diameter of the via having the concentric circular shape can significantly increase.

In the aforementioned thin-film capacitor structure, as the outer diameter of the via significantly increases, a disposition space of the via can be insufficient, which may limit the number of vias that can be disposed within the thin-film capacitor.

If the number of vias cannot be increased, equivalent series resistance (ESR) and equivalent series inductance (ESL) can be elevated.

Since low ESR and ESL is one of the key characteristics that a component of a decoupling capacitor should have, an increase in ESR and ESL limits the thin-film capacitor to be applied as a decoupling capacitor.

However, according to the exemplary embodiment, since a top view of each of the plurality of vias 31 and 32 is asymmetric in shape, and formed such that the top view of each of the plurality of vias 31 and 32 has a first axis in a direction where the plurality of vias 31 and 32 are arranged, shorter than a second axis in a direction perpendicular to the first axis to increase the stacking number of the first and second electrode layers, thus realizing a capacitor with high capacitance.

Also, since the electrode layer having the same polarity exposed within the via connecting a plurality of electrode layers is exposed to only any one of both sides based on the center of the vias and are exposed in a zigzag manner, whereby a larger number of electric layers may be electrically connected to the vias having the same area.

In detail, the plurality of vias 31 and 32 may have any one of rectangular, semicircular, and oval shapes, and FIGS. 1 and 2, for example, illustrate that the plurality of vias 31 and 32 have a rectangular shape.

According to the exemplary embodiment, a central axis of a via among the plurality of vias is offset with a central axis of an adjacent via.

In a general thin-film capacitor, an electrode layer having the same polarity exposed within each of the plurality of vias is exposed to both sides of the vias on the basis of a center of the via, and when the vias having a multi-stage shape are formed to have such a structure, an outer diameter of the via significantly increases, which causes an insufficient disposition space of the via and limits the number of vias that can be disposed.

According to the exemplary embodiment, since an upper surface of each of the plurality of vias 31 and 32 is exposed only to one of both sides of the electrode layers having the same polarity on the basis of the center of each of the plurality of vias 31 and 32 in a zigzag manner, central axes of the plurality of vias 31 and 32 may not be aligned to those of adjacent vias.

Since the plurality of vias 31 and 32 are disposed such that central axes of adjacent vias are not aligned, there may be a room for a disposition space of the vias, allowing a larger number of vias to be disposed in capacitors having the same size, and thus realizing a thin-film capacitor having low ESR and low ESL.

Figure 4A:
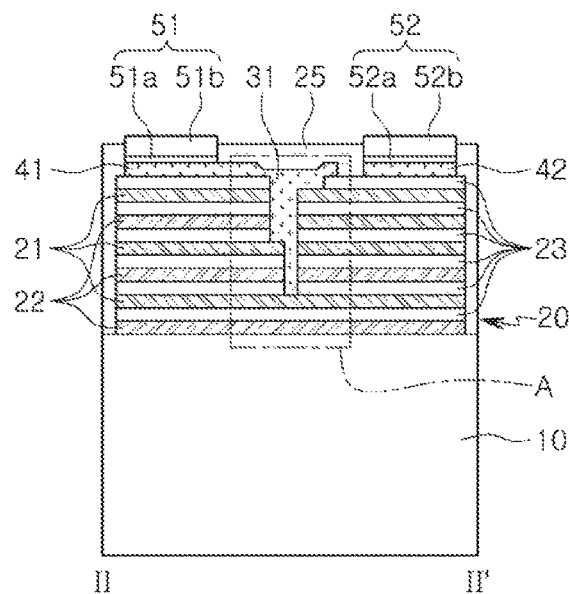
FIG. 4A is a cross-sectional view taken along line II-II' of FIG. 1
Figure 4B:
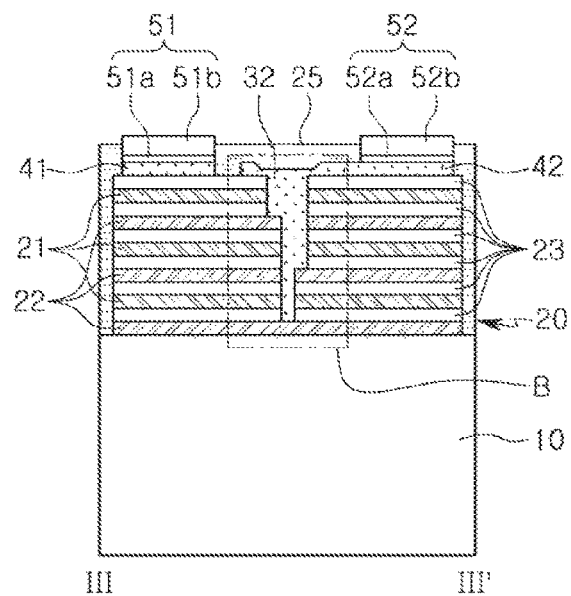
FIG. 4B is a cross-sectional view taken along line of FIG. 1.

FIG. 4A is a cross-sectional view taken along line II-II' of FIG. 1, and FIG. 4B is a cross-sectional view taken along line III-III' of FIG. 1.

Referring to FIGS. 3, 4A, and 4B, the body has a stacked structure in which the first electrode layer 21 is formed on the substrate 10, the dielectric layer 23 is formed on the first electrode layer 21, and the second electrode layer 22 is formed on the dielectric layer 23. That is, a plurality of first electrode layers 21 and a plurality of second electrode layers 22 are alternately stacked such that each dielectric layer 23 is interposed therebetween, but the stacking number of the first and second electrode layers may not be limited to the stacking number illustrated in the figures.

The body 20 may be formed by stacking the dielectric layers 23 and the first and second electrode layers 21 and 22 on the substrate such that the dielectric layers 23 and the first and second electrode layers 21 and 22 are alternately disposed.

In detail, as illustrated in FIG. 3, the body 20 may be collectively formed by stacking the plurality of dielectric layers 23 in the thickness direction and alternately stacking the first and second electrode layers 21 and 22 to face the dielectric layer 23.

In the exemplary embodiment, in order to selectively connect the collectively stacked electrode layers of the thin-film capacitor, inter-layer etching is performed to have different areas, thus forming the vias to have a multi-stage shape, i.e., a stepped shape.

Further, an insulating layer is formed on an internal electrode to be insulated among the exposed internal electrodes within the etched via having a stepped shape, thus blocking an electrical connection.

After exposing only the electrodes to be connected, a seed layer is formed through electroless plating or sputtering, and a conductive metal is subsequently filled through plating to form an electrode connection layer.

In this manner, the internal electrodes can be electrically interlayer-connected by one via.

According to the exemplary embodiment, since the thin-film capacitor is manufactured by collectively stacking the dielectric layers 23 and the first and second electrode layers 21 and 22, damage due to exposure to an external environment can be minimized.

As the first and second electrode layers 21 and 22 and the dielectric layers 23 are increasingly stacked as multiple layers, ESR of the capacitor may be decreased.

The first and second electrode layers 21 and 22 may be formed as a single layer without a predetermined pattern.

The first and second electrode layers 21 and 22 may be formed of a conductive material.

The conductive material may be copper (Cu), aluminum (Al), gold (Au), silver (Ag), platinum (Pt), iridium (Ir), ruthenium (Ru), and the like, but may not be limited thereto.

High temperature heat history may be entailed during a process of forming the dielectric layer, a high-k thin film, which may cause the electrode layer to be spread to the dielectric layer or react to the dielectric layer and increase a leakage current in the capacitor.

Here, the first and second electrode layers 21 and 22 are formed of platinum (Pt), a high melting point material, whereby spreading or reaction thereof to the dielectric layer may be reduced.

The dielectric layer 23 may include a perovskite material having high permittivity.

The perovskite material may be one selected from dielectric materials whose permittivity is significantly changed, for example, a barium titanate ($BaTiO_3$)-based material, a strontium titanate ($SrTiO_3$)-based material, a $(Ba,Sr)TiO_3$-based material, and a PZT-based material, but may not be limited thereto.

Figure 5A:
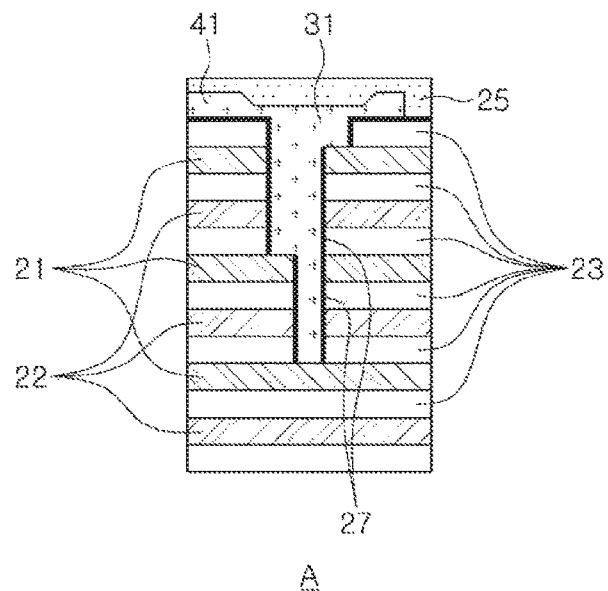
FIG. 5A is an enlarged view of a portion "A" of FIG. 4A.
Figure 5B:
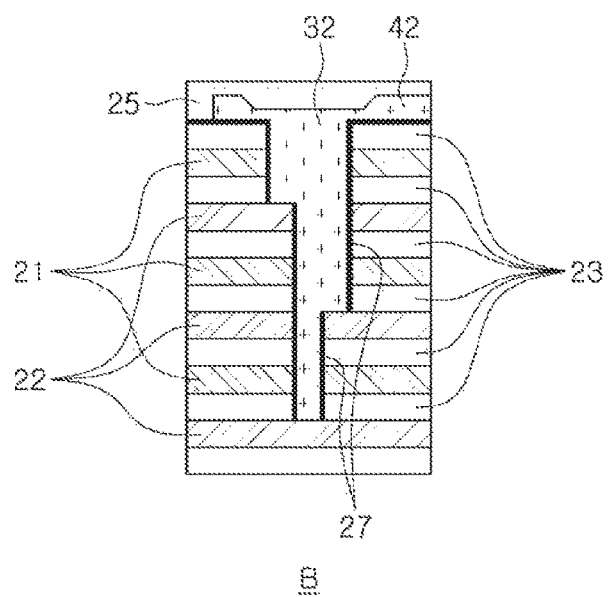
FIG. 5B is an enlarged view of a portion "B" of FIG. 4B.

FIG. 5A is an enlarged view of a portion "A" of FIG. 4A, and FIG. 5B is an enlarged view of a portion "B" of FIG. 4B.

In this disclosure, first and second may signify different polarities.

Referring to FIGS. 5A and 5B, the first via 31 is electrically connected to the first electrode layer 21, the second via 32 is electrically connected to the second electrode layer 22, and the first via 31 and the second via 32 may be electrically insulated from each other.

The first and second vias 31 and 32 may be formed of a conductive material and may be formed through plating. Accordingly, a dimple may be formed on an upper surface of each of the first and second vias 31 and 32.

Here, the conductive material may be Cu, Al, Au, Ag, Pt, and the like, but may not be limited thereto.

The first and second vias 31 and 32 are formed in plurality. When the first and second vias are formed in plurality, a contact surface of the first and second vias 31 and 32 that are in contact with the first and second electrode layers 21 and 22, respectively, may be increased to enhance reliability of electrical connection.

The first and second connection electrodes 41 and 42 are formed to connect the first and second vias 31 and 32 to the first and second electrode pads 51 and 52, respectively.

The first and second connection electrodes 41 and 42 may be formed of a conductive material and may be formed through plating.

Here, the conductive material may be Cu, Al, Au, Ag, Pt, and the like, but may not be limited thereto.

The first and second electrode pads 51 and 52 may be formed on an upper surface of the body 20 and may be electrically connected to the first and second electrode layers 21 and 22 through the plurality of vias 31 and 32 exposed to one surface of the body 20, respectively.

The first and second electrode pads 51 and 52 may be formed through electroplating or electroless plating after a seed layer is formed through a thin film formation process such as sputtering or e-beam deposition on an upper surface of the body 20.

The first and second electrode pads 51 and 52 may include a conductive material.

Here, the conductive material may be Cu, Al, Au, Ag, Pt, and the like, but may not be limited thereto.

The first and second electrode pads 51 and 52 may include seed layers 51a and 52a and electrode layers 51b and 52b disposed on the seed layers 51a and 52a.

The first and second electrode pads 51 and 52 are arranged in positions where the first and second electrode pads 51 and 52 do not overlap with the first and second vias 31 and 32 with respect to a stacking direction of the dielectric layer and the electrode layers.

However, without being limited thereto, the first and second electrode pads 51 and 52 may overlap with the first and second vias 31 and 32 as necessary.

The first and second electrode pads 51 and 52 may be integrated with the first and second connection electrodes 41 and 42 or may be disposed on the first and second connection electrodes 41 and 42.

Due to the disposition of the vias 31 and 32, the first and second connection electrodes 41 and 42 may have a comb shape. The comb shape of the first and second connection electrodes 41 and 42 may be a shape in which the first and second connection electrodes are alternately engaged.

In detail, the first connection electrode 41 may include a plurality of first connection portions respectively connected from the plurality of first vias 31 and a first electrode portion connected to the plurality of first connection portions, and the second connection electrode 42 may include a plurality of second connection portions respectively connected from the plurality of second vias 32 and a second electrode portion connected to the plurality of second connection portions.

Since the first connection electrode 41 and the second connection electrode 42 also have mutually opposite polarities, better ESL reduction effect may be obtained as the first connection electrode and the second connection electrode are closer to each other.

The plurality of first and second connection portions may be branches extending from the plurality of first and second vias 31 and 32.

Referring to FIGS. 5A and 5B, an insulating layer 27 may be formed to electrically connect the first via 31 and the second via 32 to the first electrode layer 21 and the second electrode layer 22, respectively.

The insulating layer 27 may be formed between the first via 31 and a group of the dielectric layer 23 and the second electrode layer 22, and between the second via 32 and a group of the dielectric layer 23 and the first electrode layer 21.

That is, the insulating layer 27 may secure insulation between the first via 31 and the second electrode layer 22 and insulation between the second via 32 and the first electrode layer 21. Since the insulating layer 27 is formed on a surface of the dielectric layer 23, parasitic capacitance generated therein may be reduced.

The insulating layer 27 may be formed of an organic material such as benzocyclobutene (BCB), polyimide, and the like, or an inorganic material such as $SiO_2$, $Si_3N_4$, and the like, and has permittivity lower than that of a material of the dielectric layer in order to obtain high insulating properties and reduce parasitic capacitance.

The insulating layer 27 may be formed through chemical vapor deposition (CVD) allowing a film to have a uniform thickness in a three-dimensionally complex shape.

A protective layer 25 may be formed to prevent a degradation of a material of the body 20 and the first and second connection electrodes 41 and 42 due to a chemical reaction that may be made with humidity and oxygen from the outside, contamination, and damage when the capacitor is mounted.

The protective layer 25 may be formed of a material with high heat resistance and may be formed of an organic heat-curing material or a photo-curing material such as polyimide, for example.

In detail, among the plurality of vias 31 and 32, the first via 31 connects the first electrode layer 21 and the first electrode pad 51 and penetrates through from one surface of the body 20 to the first electrode layer 21 as a lowermost layer adjacent to the substrate 10.

Also, among the plurality of vias 31 and 32, the second via 32 connects the second electrode layer 22 and the second electrode pad 52 and penetrates through from one surface of the body 20 to the second electrode layer 2 as a lowermost layer adjacent to the substrate 10.

According to an exemplary embodiment, the plurality of vias 31 and 32 have a multi-stage shape, i.e., a stepped shape, and widths of the respective steps are increased upwardly from the substrate 10 in the body 20.

Since the first and second vias 31 and 32 are manufactured such that widths of the respective steps thereof are increased upwardly from the substrate 10 in the body 20, the first via 31 may be connected to the entirety of the first electrode layers 21 disposed within the body 20 and the second via 32 may be connected to the entirety of the second electrode layers 22 disposed within the body 20.

Also, since the first and second vias 31 and 32 are formed such that widths of the respective steps thereof are increased upwardly from the substrate 10 in the body 20, the insulating layer 27 may be disposed on the etched cut surfaces of the first electrode layer 21 exposed within the first via 31 and the second electrode layer 22 exposed within the second via 32 and upper surfaces of the first electrode layer 21 and the second electrode layer 22 may be exposed.

The first via 31 is formed by performing etching repeatedly up to a layer from which the first electrode layer 21 is exposed and has a multi-stage shape, i.e., a stepped shape, and since the widths of the steps are increased upwardly from the substrate 10 in the body 20, the insulating layer 27 may be disposed on the etched cut surfaces of the dielectric layer 23 and the first and second electrode layers 21 and 22 and only an upper surface of the first electrode layer 21 may be exposed after the insulating process.

Accordingly, the entire first electrode layers 21 are electrically connected to each other within the first via 31 and may be electrically connected to the first electrode pad 51 through the first via 31.

The second via 32 is formed by performing etching repeatedly up to a layer from which the second electrode layer 22 is exposed and has a multi-stage shape, i.e., a stepped shape, and since the widths of the steps are increased upwardly from the substrate 10 in the body 20, the insulating layer 27 may be disposed on the etched cut surfaces of the dielectric layer 23 and the first and second electrode layers 21 and 22 and only an upper surface of the second electrode layer 22 may be exposed after the insulating process.

Accordingly, the entire the second electrode layers 22 are electrically connected within the second via 32 and may be electrically connected to the second electrode pad 52 through the second via 32.

Also, the insulating layer 27 may be disposed on the second electrode layer 22 exposed within the second via 32 and on the first electrode layer 21 exposed within the second via 32.

In detail, the insulating layer 27 may be disposed on the etched cut surfaces of the second electrode layer 22 exposed within the firs via 31 and the first electrode layer 21 exposed within the second via 32.

According to the exemplary embodiment, the first via 31 may be connected to the entirety of first electrode layers 21 disposed within the body 20, and the second via 32 may be connected to the entirety of the second electrode layers 22 disposed within the body 20.

In the exemplary embodiment, since the first via 31 is connected to the entirety of the first electrode layers 21 and the second via 32 is connected to the entirety of the second electrode layers 22, there is no problem in formation of capacitance even when the vias are not connected to one or a plurality of internal electrodes due to a process deviation.

That is, in a structure in which one via is connected to one internal electrode as in the related art, if the connection fails, capacitance may not be formed to result in a degradation of capacitance of the capacitor.

However, according to the exemplary embodiment, since the first via 31 is connected to the entirety of the first electrode layers 21 and the second via 32 is connected to the entirety of the second electrode layers 22, although connection between some of the internal electrodes and the via fails, there is no problem in formation of capacitance, obtaining excellent reliability.

The first via 31 is provided in plural and the plurality of first vias 31 have the same depth, and the second via 32 is provided in plural and the plurality of second vias 32 have the same depth.

That is, the first via 31 penetrates through from one surface of the body 20 to the lowermost first electrode layer 21, the second via 32 penetrates through from one surface of the body 20 to the lowermost second electrode layer 21, the plurality of first vias have the same depth, and the plurality of second vias also have the same depth.

According to the exemplary embodiment, an upper surface of the first electrode layer 21 exposed within the first via 31 and an upper surface of the second electrode layer 22 exposed within the second via 32 may be exposed in a zigzag manner within each via.

As for the upper surface of the first electrode layer 21 exposed within the first via 31 and the upper surface of the second electrode layer 22 exposed within the second via 32, only one of both upper surfaces with respect to the center of the via in one electrode layer may be exposed.

Also, in the electrode layer adjacent to the one electrode layer and having the same polarity, the other upper surface with respect to the center of the via may be exposed.

Accordingly, the first electrode layer 21 exposed within the first via 31 and the second electrode layer 22 exposed within the second via 32 may be exposed in the vias in a zigzag manner.

That is, the first electrode layer 21 exposed within the first via 31 and the second electrode layer 22 exposed within the second via 32 may be exposed in an asymmetric form within the vias.

In general, since the plurality of vias have the multi-stage shape, a stepped shape, and widths of the respective steps are increased upwardly from the substrate in the body, each of the electrode layers has an exposed portion in both upper surfaces with respect to the center of the plurality of vias.

According to the exemplary embodiment, within the first via 31, in one of the plurality of first electrode layers 21, only one of both upper surfaces with respect to the center of the via is exposed.

In this manner, although only one of both upper surfaces of the first electrode layer 21 in one layer is exposed, the entire first electrode layer 21 may be electrically connected and may be electrically connected to the first electrode pad 51 through the first via 31.

Within the second via 32, only one of both upper surfaces with respect to the center of the via in one of the second electrode layers 22 is exposed.

In this manner, although only one of both upper surfaces of the second electrode layer 22 in one layer is exposed, the entire second electrode layer 22 may be electrically connected and may be electrically connected to the second electrode pad 52 through the second via 32.

According to the exemplary embodiment, the electrode layer having the same polarity exposed within the via connecting the plurality of electrode layers is exposed to only one of both sides on the basis of the center of the via, and since the electrode layers are exposed in a zigzag manner, a size of the via may be reduced, and thus, a larger number of vias may be positioned in capacitors having the same size.

Also, since a top view of each of the plurality of vias 31 and 32 is asymmetric in shape, and formed such that the top view of each of the plurality of vias 31 and 32 has a first axis in a direction where the plurality of vias 31 and 32 are arranged, shorter than a second axis in a direction perpendicular to the first axis, a thin-film capacitor including a larger number of vias and having low ESR and ESL may be realized.

Figure 6:
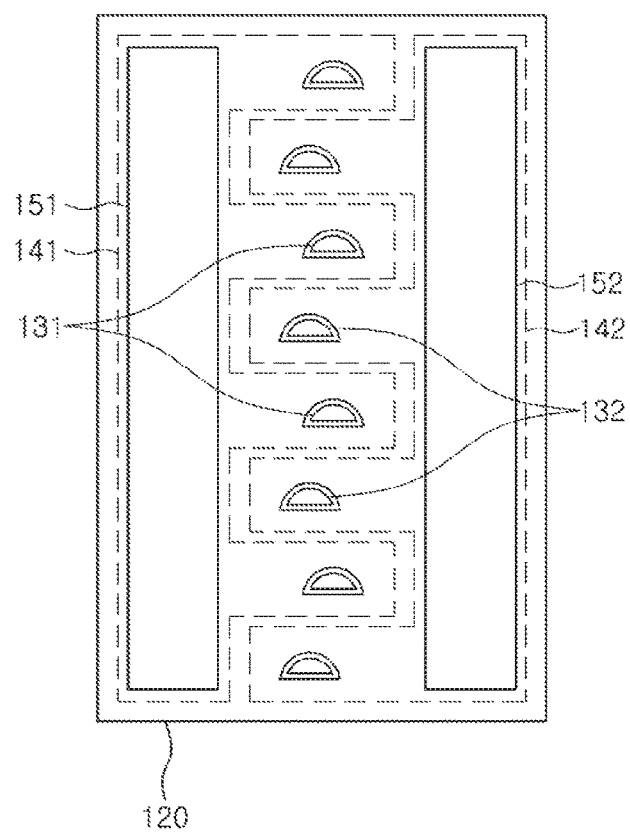
FIGS. 6 and 7 are schematic planar views of a thin-film capacitor according to another exemplary embodiment.
Figure 7:
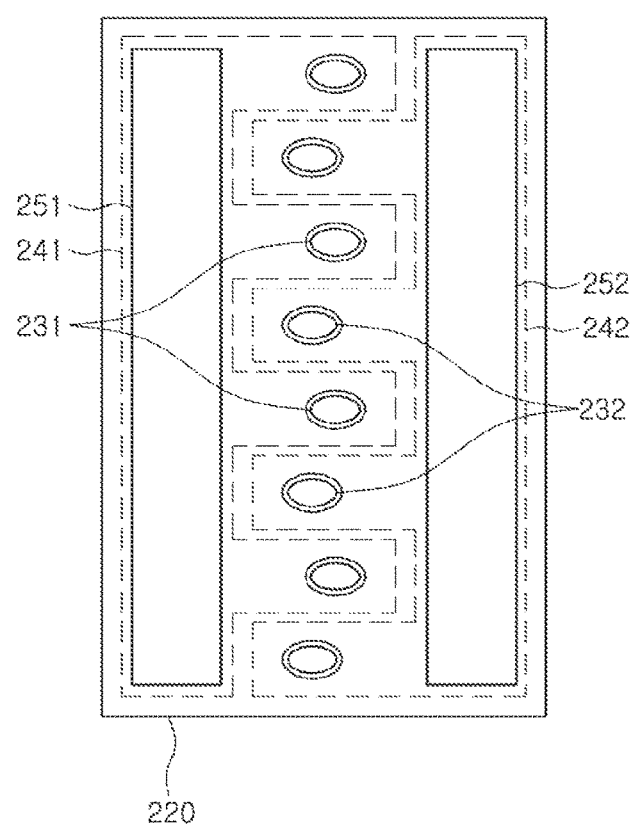

FIGS. 6 and 7 are schematic planar views of a thin-film capacitor according to another exemplary embodiment.

Descriptions of components illustrated in FIGS. 6 and 7 which are the same as those illustrated in FIGS. 1 through 5 will be omitted.

Referring to FIGS. 6 and 7, a plurality of vias 131, 132, 231, and 232 may have any one of semicircular and oval shapes.

Also, the thin-film capacitor according to another exemplary embodiment may include first and second connection electrodes 141, 142, 241, and 242 having a comb shape, and first and second electrode pads 151, 152, 251, and 252.

Hereinafter, an example of manufacturing a thin-film capacitor according to an exemplary embodiment will be described, but the present disclosure is not limited thereto.

FIGS. 8A through 8J are views illustrating a sequential process of forming a via within a thin-film capacitor according to an exemplary embodiment.

Hereinafter, a process of forming a via within a thin-film capacitor will be described with reference to FIGS. 8A through 8J.

Figure 8A:
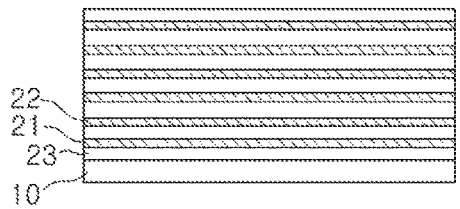
FIGS. 8A through 8J are views illustrating a sequential process of forming a via within a thin-film capacitor according to an exemplary embodiment.

Referring to FIG. 8A, a stacked body may be prepared by stacking a dielectric layer 23 and first and second electrode layers 21 and 22 on a substrate 10 such that the dielectric layer 23 and the first and second electrode layers 21 and 22 are alternately disposed.

The substrate 10 may be made of, but not limited to, prepreg, for example.

A perovskite-based dielectric material such as barium titanate ($BaTiO_3$), or the like, is deposited on the substrate 10 to form the dielectric layer 23, and a conductive metal is deposited thereon using a thin film formation process such as sputtering, e-beam deposition, and the like, to form the first electrode layer 21, and the dielectric layer 23 and the second electrode layer 22 are formed thereon.

Accordingly, the plurality of first and second electrode layers 21 and 22 are formed to be alternately stacked on both opposing surfaces of the dielectric layer 23.

The dielectric layer 23 and the first and second electrode layers 21 and 22 may be stacked through deposition but not limited thereto and may also be formed through a method such as chemical solution deposition (CSD).

The dielectric layer 23 and the first and second electrode layers 21 and 22 are collectively stacked without separate patterning in a vacuum state.

Figure 8B:
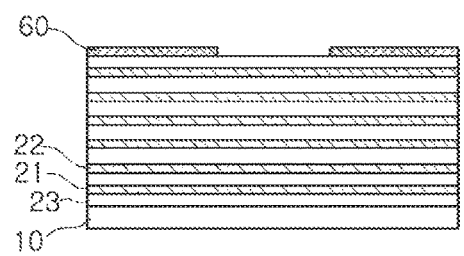

Referring to FIG. 8B, a photoresist 60 is applied to an upper surface of the stacked boy in order to expose interlayer electrodes disposed in the stacked body, and patterned through exposure and development.

Figure 8C:
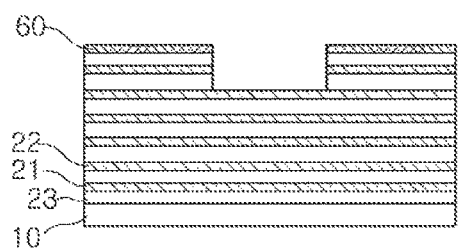

Referring to FIG. 8C, etching is performed up to a predetermined electrode layer to form a via.

The via illustrated in FIG. 8C is a first via formed by etching up to the first electrode layer adjacent to an upper surface of the stacked body such that the first electrode layer closest to the upper surface of the stacked body is exposed.

Figure 8D:
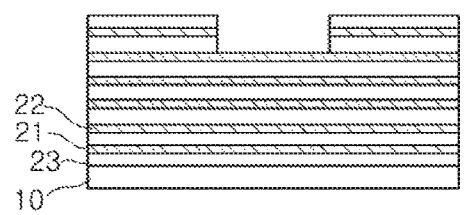

Referring to FIG. 8D, the patterned photoresist 60 is removed.

Figure 8E:
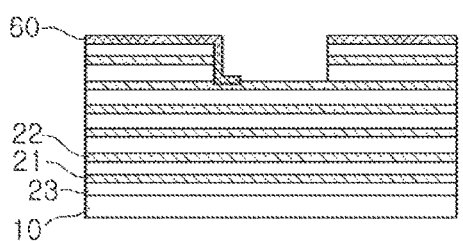

Referring to FIG. 8E, the photoresist 60 is applied from the upper surface of the stacked body to a lower surface of the via, i.e., to an upper surface of the exposed first electrode layer, and patterned through exposure and development.

The patterned photoresist 60 is patterned to have an area narrower than that of the photoresist patterned in FIG. 8B.

Figure 8F:
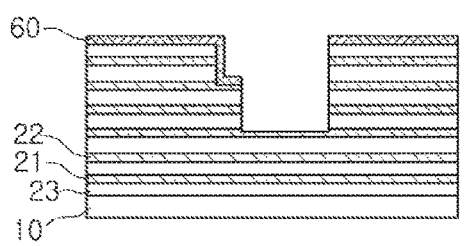

Referring to FIG. 8F, etching is performed up to a next predetermined electrode layer to form a via.

The via illustrated in FIG. 8F is a first via which is formed by etching up to the first electrode layer closest to the upper surface of the stacked body in a direction of the substrate such that a first electrode layer next to the first electrode layer closest to the upper surface of the stacked body is exposed, so as to be connected to the first electrode layer.

During the etching process, the dielectric layer and the second electrode layer disposed between the first electrode layer closest to the upper surface and the next first electrode layer are simultaneously exposed.

That is, layers penetrated through per one etching process include two or more electrodes and the dielectric layer.

The via is formed to have a width smaller than that of the via formed by etching such that the first electrode layer closest to the upper surface of the stacked body is exposed.

According to the exemplary embodiment, a plurality of vias are formed by repeating the aforementioned process, and here, each of the vias is formed such that a width thereof is smaller than that of an upper via adjacent thereto.

Figure 8G:
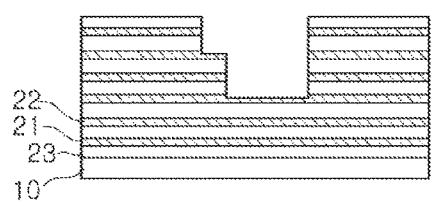

In detail, referring to FIG. 8G, the patterned photoresist 60 is removed.

Figure 8H:
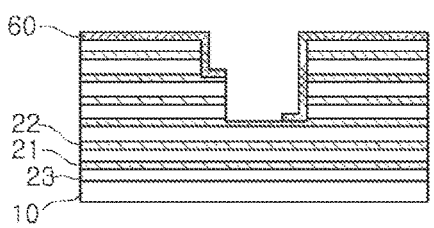

Referring to FIG. 8H, photoresist is applied from the upper surface of the stacked body to a lower surface of the via formed in FIG. 8F, i.e., to an upper surface of the exposed first electrode layer and patterned through exposure and development.

The patterned photoresist 60 is patterned to have an area narrower than that of the photoresist 60 patterned in FIG. 8E.

Figure 8I:
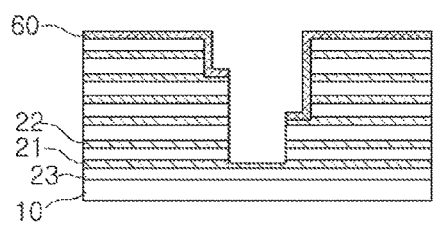

Referring to FIG. 8I, etching is performed up to a next predetermined electrode layer to form a via.

As illustrated in FIG. 8I, etching is performed such that a first electrode layer disposed below the first electrode layer exposed in FIG. 8F is exposed to form a via.

Through the etching, a dielectric layer and a second electrode layer disposed between the first electrode layer exposed in FIG. 8F and the first electrode layer disposed therebelow are simultaneously exposed.

The via is formed to have a width smaller than that of the via formed in FIG. 8F.

Figure 8J:
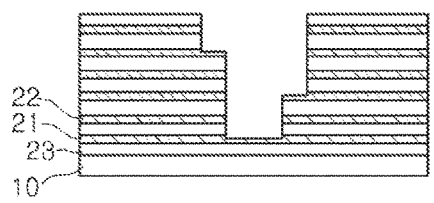

Referring to FIG. 8J, the patterned photoresist 60 is removed.

FIGS. 9A through 9D are views illustrating a sequential process of forming an insulating layer in a via within a thin-film capacitor according to another exemplary embodiment.

FIGS. 9A through 9D illustrate a process of patterning an insulating layer to selectively connect exposed electrodes.

That is, the first via is required to be connected to the first electrode layer and the simultaneously exposed second electrode layer should be insulated, and the second via is required to be connected to the second electrode layer and the simultaneously exposed first electrode layer should be insulated.

Thus, in the case of the first via, the second electrode layer should be blocked from an electrical connection by a dielectric or insulating layer, and in the case of the second via, the first electrode layer should be blocked from an electrical connection by a dielectric or insulating layer.

Figure 9A:
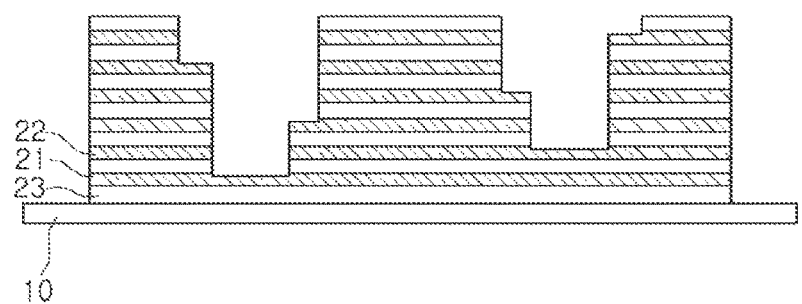
FIGS. 9A through 9D are views illustrating a sequential process of forming an insulating layer in a via within a thin-film capacitor according to an exemplary embodiment.

FIG. 9A illustrates a cross-section of a stacked body in which the first via and the second via are formed through the process of FIGS. 8A through 8J.

The first via penetrates through from one surface of the stacked body to a lowermost first electrode layer adjacent to the substrate 10, and the second via penetrates through from one surface of the stacked body to a lowermost second electrode layer adjacent to the substrate 10.

According to the exemplary embodiment, the first and second vias have a multi-stage shape, a stepped shape, and widths of the steps are increased upwardly from the substrate 10 in the stacked body.

In this manner, since the widths of the steps of the first and second vias are manufactured to be increased upwardly from the substrate 10 in the stacked body, the first via may be connected to the entirety of the first electrode layers and the second via may be connected to the entirety of the second electrode layers.

Figure 9B:
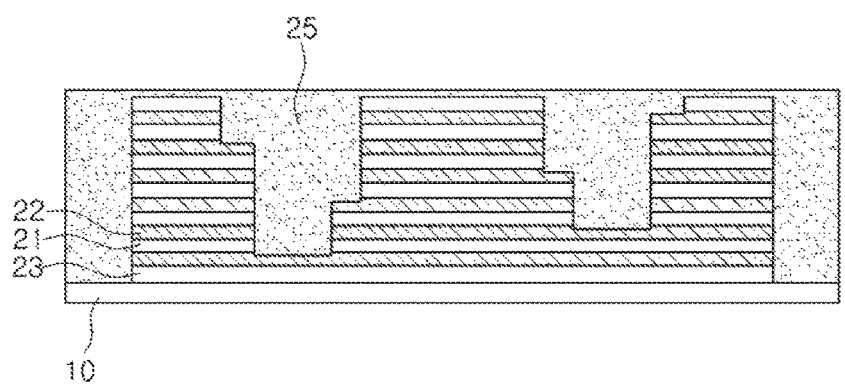

Referring to FIG. 9B, after the plurality of vias having a multi-stage shape are formed within the stacked body, the upper surface of the substrate 10 and the entirety of the stacked body are coated with an insulating material.

Figure 9C:
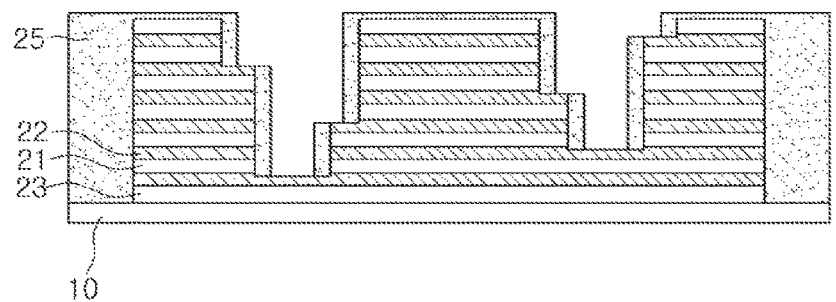

Referring to FIG. 9C, the insulating material is etched to form an insulating layer and a protective layer 25 within the plurality of vias 31 and 32.

The insulating layer is formed on etched cut surfaces of the dielectric layer 23 and the first and second electrode layers 21 and 22 within the plurality of vias 31 and 32.

Since the widths of the steps of the first and second vias are increased upwardly from the substrate 10 in the stacked body, the insulating layer may be disposed on the etched cut surface of the first electrode layer 21 exposed within the first via 31 and the etched cut surface of the second electrode layer 22 exposed within the second via 32 and upper surfaces of the first electrode layer 21 and the second electrode layer 22 may be exposed.

Also, the first via 31 is formed by performing etching repeatedly a plurality of times to a layer from which the first electrode layer 21 is exposed, and has a multi-stage shape as a stepped shape, and since the widths of the steps are increased upwardly from the substrate 10 in the stacked body, the insulating layer may be disposed on the etched cut surfaces of the dielectric layer 23 and the first and second electrode layers 21 and 22 and only an upper surface of the first electrode layer 21 may be exposed after the insulation process.

The second via 32 is formed by performing etching repeatedly a plurality of times to a layer from which the second electrode layer 22 is exposed, and has a multi-stage shape as a stepped shape, and since the widths of the steps are increased upwardly from the substrate 10 in the stacked body, the insulating layer may be disposed on the etched cut surfaces of the dielectric layer 23 and the first and second electrode layers 21 and 22 and only an upper surface of the second electrode layer 22 may be exposed after the insulation process.

According to the exemplary embodiment, the first via 31 may be connected to the entirety of the first electrode layers 21 disposed within the stacked body, and the second via 32 may be connected to the entirety of the second electrode layer 22 disposed within the stacked body.

The first via 31 is provided in plural and the plurality of first vias 31 have the same depth, and the second via 32 is provided in plural and the plurality of second vias 32 have the same depth.

The upper surface of the first electrode layer 21 exposed within the first via 31 and the upper surface of the second electrode layer 22 exposed within the second via 32 may be exposed in a zigzag manner within each of the vias.

As for the upper surface of the first electrode layer 21 exposed within the first via 31 and the upper surface of the second electrode layer 22 exposed within the second via 32, only one of them may be exposed in one electrode layer on the basis of the center of the via.

Also, in an electrode layer adjacent to the one electrode layer and having the same polarity, the other upper surface thereof with respect to the center of the via may be exposed.

Figure 9D:
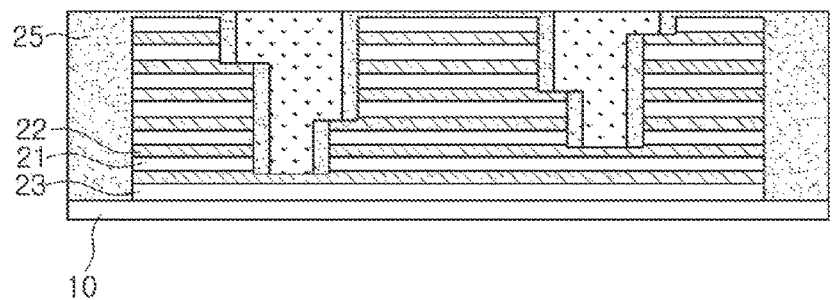

Referring to FIG. 9D, the first and second vias 31 and 32 are filled with a conductive metal. In the process of filling the first and second vias 31 and 32 with a conductive metal, a seed layer is formed on a surface of each of the exposed electrode layer and a conductive metal is filled through a plating method to connect the electrode layer and an external electrode.

As set forth above, according to the exemplary embodiment, since the dielectric and the electrodes are stacked collectively and subsequently electrically connected to the via having a multi-stage shape, when a thin film is deposited, damage due to an external environment may be minimized and a thinner compact product may be realized.

Also, since all the layers required to be electrically connected are connected by one via, a reduction in an area of the dielectric due to via may be minimized to increase capacitance.

Moreover, since a product structure is simplified through insulating layer patterning within the via, the stacking number of the thin-film capacitor may be increased to obtain high capacitance.

Furthermore, the thin-film capacitor according to the exemplary embodiment may have low ELS and low ESR.

In addition, since the electrode layer having the same polarity exposed within the via connecting the plurality of electrode layers is exposed to only one of both sides on the basis of the center of the via and is exposed in a zigzag manner, a size of the via in the shorter direction is limited, and thus, when the via is disposed in the first axis direction, a larger number of vias may be positioned within capacitors having the same size.

Further, when the stacking number of the electrode layers increases, the size of the via may significantly increases in the second axis direction but not significantly in the first axis direction, and thus, when a plurality of vias are disposed in the first axis direction, a relatively large number of vias may be disposed although the stacking number of the electrode layers is increased.

Further, since a large number of vias are disposed in the thin-film capacitor, the thin-film capacitor may have lower ESR and ESL characteristics.

While example embodiments have been shown and described above, it will be apparent to those skilled in the art that modifications and variations could be made without departing from the scope of the present invention as defined by the appended claims.

What is claimed is:

1. A thin-film capacitor comprising:
    a body in which a plurality of dielectric layers and first and second electrode layers are alternately disposed on a substrate; and
    first and second electrode pads disposed on external surfaces of the body,
    wherein a plurality of vias are disposed within the body, and
    the plurality of vias includes,
        a first via electrically connects the first electrode layer and the first electrode pad and penetrates through from one surface of the body to a lowermost first electrode layer adjacent to the substrate; and
        a second via electrically connects the second electrode layer and the second electrode pad and penetrates through from one surface of the body to a lowermost second electrode layer adjacent to the substrate,
    wherein the plurality of vias have a multi-stage shape, a top view of each of the plurality of vias is asymmetric in shape, and the top view of each of the plurality of vias has a first dimension in a direction where the plurality of vias are arranged, shorter than a second dimension in a direction perpendicular to the first dimension, and
    wherein the one or more exposed upper surfaces of the first electrode layers within the first via and the one or more exposed upper surfaces of the second electrode layers within the second via are exposed in a zigzag manner.

2. The thin-film capacitor of claim 1, wherein a central axis of a via among the plurality of vias is offset with a central axis of an adjacent via.

3. The thin-film capacitor of claim 1, wherein the first via is connected to the entirety of the first electrode layers disposed within the body.

4. The thin-film capacitor of claim 1, wherein the second via is connected to the entirety of the second electrode layers disposed within the body.

5. The thin-film capacitor of claim 1, wherein the first via is provided in plural and the plurality of first vias have the same depth.

6. The thin-film capacitor of claim 1, wherein the second via is provided in plural and the plurality of second vias have the same depth.

7. The thin-film capacitor of claim 1, wherein an insulating layer is disposed on a second electrode layer exposed within the first via and a first electrode layer exposed within the second via.

8. The thin-film capacitor of claim 1, wherein one or more upper surfaces of the first electrode layers are exposed within the first via and one or more upper surfaces of the second electrode layers are exposed within the second via.

9. The thin-film capacitor of claim 8, wherein, among the one or more exposed upper surfaces of the first electrode layers within the first via, only one upper surface of one first electrode layer is exposed at one side with respect to a center of the first via, and among the one or more exposed upper surfaces of the second electrode layers within the second via, only one upper surface of one second electrode layer is exposed at one side with respect to a center of the second via.

10. The thin-film capacitor of claim 9, wherein, another first electrode layer adjacent to the one first electrode layer has an exposed upper surface at the other side with respect to the center of the first via, and another second electrode layer adjacent to the one second electrode layer has an exposed upper surface at the other side with respect to the center of the second via.

11. The thin-film capacitor of claim 1, wherein widths of steps of the plurality of vias are increased upwardly from the substrate in the body.

12. The thin-film capacitor of claim 1, wherein the plurality of vias have any one of rectangular, semicircular, and oval shapes.

* * * * *